United States Patent
Spry et al.

(10) Patent No.: US 8,868,992 B2
(45) Date of Patent: Oct. 21, 2014

(54) ROBUST MEMORY LINK TESTING USING MEMORY CONTROLLER

(75) Inventors: Bryan L. Spry, Portland, OR (US); Theodore Z. Schoenborn, Portland, OR (US); Philip Abraham, Beaverton, OR (US); Christopher P. Mozak, Beaverton, OR (US); David G. Ellis, Beaverton, OR (US); Jay J. Nejedlo, Wilsonville, OR (US); Bruce Querbach, Hillsboro, OR (US); Zvika Greenfield, Kfar Sava (IL); Rony Ghattas, Hillsboro, OR (US); Jayasekhar Tholiyil, Hillsboro, OR (US); Charles D. Lucas, Bonney Lake, WA (US); Christopher E. Yunker, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/651,252

(22) Filed: Dec. 31, 2009

(65) Prior Publication Data
US 2011/0161752 A1 Jun. 30, 2011

(51) Int. Cl.
*G06F 11/00* (2006.01)
*G11C 29/08* (2006.01)

(52) U.S. Cl.
CPC ........................... *G11C 29/08* (2013.01)
USPC ............................................. 714/739; 714/738

(58) Field of Classification Search
USPC .................. 714/718–724, 745, 711, 710; 365/200–201
See application file for complete search history.

(56) References Cited

U.S. PATENT DOCUMENTS

| | | | | |
|---|---|---|---|---|
| 5,258,986 A | * | 11/1993 | Zerbe | 365/201 |
| 5,636,225 A | * | 6/1997 | Osawa | 714/718 |
| 5,640,509 A | * | 6/1997 | Balmer et al. | 714/42 |
| 5,675,749 A | * | 10/1997 | Hartvigsen et al. | 710/305 |
| 5,790,626 A | * | 8/1998 | Johnson et al. | 377/69 |
| 5,930,814 A | * | 7/1999 | Lepejian et al. | 711/1 |
| 6,006,345 A | | 12/1999 | Berry, Jr. | |
| 6,072,737 A | * | 6/2000 | Morgan et al. | 365/201 |
| 6,550,023 B1 | * | 4/2003 | Brauch et al. | 714/42 |
| 6,662,327 B1 | * | 12/2003 | Rajski | 714/738 |
| 7,178,076 B1 | * | 2/2007 | Zarrineh et al. | 714/733 |
| 7,197,678 B2 | * | 3/2007 | Ohlhoff et al. | 714/719 |

(Continued)

FOREIGN PATENT DOCUMENTS

| | | |
|---|---|---|
| JP | 63-268198 A | 11/1988 |
| JP | 63-268199 A | 11/1988 |

(Continued)

OTHER PUBLICATIONS

Jain, S.K.; Stroud, C.E.;, "Built-in Self Testing of Embedded Memories," Design & Test of Computers, IEEE , vol. 3, No. 5, pp. 27-37, Oct. 1986.*

(Continued)

*Primary Examiner* — Steve Nguyen
(74) *Attorney, Agent, or Firm* — Jordan IP Law, LLC (57) ABSTRACT

REUT (Robust Electrical Unified Testing) for memory links is introduced which speeds testing, tool development, and debug. In addition it provides training hooks that have enough performance to be used by BIOS to train parameters and conditions that have not been possible with past implementations. Address pattern generation circuitry is also disclosed.

13 Claims, 10 Drawing Sheets

(56) References Cited

U.S. PATENT DOCUMENTS

| | | |
|---|---|---|
| 7,370,250 B2 * 5/2008 | Yuan | 714/718 |
| 7,386,776 B2 * 6/2008 | Arnold et al. | 714/738 |
| 7,421,629 B2 * 9/2008 | Bucksch et al. | 714/718 |
| 7,444,559 B2 * 10/2008 | Swanson et al. | 714/718 |
| 2009/0024885 A1 * 1/2009 | Anzou et al. | 714/719 |
| 2013/0031408 A1 1/2013 | Beck | |

FOREIGN PATENT DOCUMENTS

| | | |
|---|---|---|
| JP | 64-70999 A | 3/1989 |
| JP | 7-73695 A | 3/1995 |
| JP | 9-63298 A | 3/1997 |
| JP | 9-91997 A | 4/1997 |
| JP | 10-214175 A | 8/1998 |
| JP | 11-116393 A | 4/1999 |
| JP | 3271307 B2 | 4/2002 |
| JP | 2003-007097 A | 1/2003 |
| JP | 2003-344489 A | 12/2003 |
| JP | 2010-55350 A | 3/2010 |
| KR | 10-2001-0037848 A | 5/2001 |
| WO | 2007102485 A1 | 9/2007 |
| WO | 2011081843 A2 | 7/2011 |
| WO | 2011081843 A3 | 11/2011 |

OTHER PUBLICATIONS

International Preliminary Report on Patentability and Written Opinion received for International Patent Application No. PCT/US2010/059823, mailed on Jul. 12, 2012, 8 pages.

International Search report and Written Opinion received for International Patent Application No. PCT/US2010/059823, mailed on Sep. 14, 2011, 12 pages.

Office Action received for Korean Patent Application No. 10-2011-7031641, mailed on Mar. 19, 2013, 8 pages of Office Action including 3 pages of English translation.

Office Action received for Japanese Patent Application No. 2012-515233, mailed on Jun. 25, 2013, 4 pages of office action including 2 pages of English translation.

Office Action received for Korean Patent Application No. 10-2011-7031641, mailed on Oct. 29, 2013, 6 pages of Office Action including 3 pages of English translation.

Office Action received for Japanese Patent Application No. 2012-515233, mailed on Dec. 3, 2013, 3 pages of Office Action Including 2 page of English Translation.

Chinese Office Action dated Dec. 26, 2013 for Chinese Patent Application No. 201080026563.8, 17 pages, including 11 pages of English translation.

* cited by examiner

| LFSR1 | LFSR2 | LFSR3 | PATTERN$_{OUT}$ | i$_{111}$ | i$_{110}$ | i$_{101}$ | i$_{100}$ | i$_{011}$ | i$_{010}$ | i$_{001}$ | i$_{000}$ |
|---|---|---|---|---|---|---|---|---|---|---|---|
| 0 | 0 | 0 | 0 | X | X | X | X | X | X | X | 0 |
| 0 | 0 | 1 | 1 | X | X | X | X | X | X | 1 | X |
| 0 | 1 | 0 | 0 | X | X | X | X | X | 0 | X | X |
| 0 | 1 | 1 | 1 | X | X | X | X | 1 | X | X | X |
| 1 | 0 | 0 | 0 | X | X | X | 0 | X | X | X | X |
| 1 | 0 | 1 | 1 | X | X | 1 | X | X | X | X | X |
| 1 | 1 | 0 | 1 | X | 1 | X | X | X | X | X | X |
| 1 | 1 | 1 | 0 | 0 | X | X | X | X | X | X | X |

*FIG. 3*

| | LANE 3 (AGGRESSOR 1) | LANE 2 (VICTIM) | LANE 1 (AGGRESSOR 2) | LANE 0 (AGGRESSOR 3) |
|---|---|---|---|---|
| CACHE LINE 31 | LFSR1 | 1010 | LFSR2 | LFSR1 + LFSR2 |
| CACHE LINE 30 | LFSR1 | 1010 | LFSR2 | LFSR1 + LFSR2 |
| CACHE LINE 29 | LFSR1 | 1010 | LFSR2 | LFSR1 + LFSR2 |
| CACHE LINE 28 | LFSR1 | 1010 | LFSR2 | LFSR1 + LFSR2 |
| CACHE LINE 27 | LFSR1 | 1010 | LFSR2 | LFSR1 + LFSR2 |
| CACHE LINE 26 | LFSR1 | 1010 | LFSR2 | LFSR1 + LFSR2 |
| CACHE LINE 25 | LFSR1 | 1010 | LFSR2 | LFSR1 + LFSR2 |
| CACHE LINE 24 | LFSR1 | 1010 | LFSR2 | LFSR1 + LFSR2 |
| CACHE LINE 23 | LFSR1 | 1010 | LFSR2 | LFSR1 + LFSR2 |
| CACHE LINE 22 | LFSR1 | 1010 | LFSR2 | LFSR1 + LFSR2 |
| CACHE LINE 21 | LFSR1 | 1010 | LFSR2 | LFSR1 + LFSR2 |
| CACHE LINE 20 | LFSR1 | 1010 | LFSR2 | LFSR1 + LFSR2 |
| CACHE LINE 19 | LFSR1 | 1010 | LFSR2 | LFSR1 + LFSR2 |
| CACHE LINE 18 | LFSR1 | 1010 | LFSR2 | LFSR1 + LFSR2 |
| CACHE LINE 17 | LFSR1 | 1010 | LFSR2 | LFSR1 + LFSR2 |
| CACHE LINE 16 | LFSR1 | 1010 | LFSR2 | LFSR1 + LFSR2 |
| CACHE LINE 15 | LFSR1 | 1010 | LFSR2 | LFSR1 + LFSR2 |
| CACHE LINE 14 | LFSR1 | 1010 | LFSR2 | LFSR1 + LFSR2 |
| CACHE LINE 13 | LFSR1 | 1010 | LFSR2 | LFSR1 + LFSR2 |
| CACHE LINE 12 | LFSR1 | 1010 | LFSR2 | LFSR1 + LFSR2 |
| CACHE LINE 11 | LFSR1 | 1010 | LFSR2 | LFSR1 + LFSR2 |
| CACHE LINE 10 | LFSR1 | 1010 | LFSR2 | LFSR1 + LFSR2 |
| CACHE LINE 9 | LFSR1 | 1010 | LFSR2 | LFSR1 + LFSR2 |
| CACHE LINE 8 | LFSR1 | 1010 | LFSR2 | LFSR1 + LFSR2 |
| CACHE LINE 7 | LFSR1 | 1010 | LFSR2 | LFSR1 + LFSR2 |
| CACHE LINE 6 | LFSR1 | 1010 | LFSR2 | LFSR1 + LFSR2 |
| CACHE LINE 5 | LFSR1 | 1010 | LFSR2 | LFSR1 + LFSR2 |
| CACHE LINE 4 | LFSR1 | 1010 | LFSR2 | LFSR1 + LFSR2 |
| CACHE LINE 3 | LFSR1 | 1010 | LFSR2 | LFSR1 + LFSR2 |
| CACHE LINE 2 | LFSR1 | 1010 | LFSR2 | LFSR1 + LFSR2 |
| CACHE LINE 1 | LFSR1 | 1010 | LFSR2 | LFSR1 + LFSR2 |
| CACHE LINE 0 | LFSR1 | 1010 | LFSR2 | LFSR1 + LFSR2 |

| SG₁ | SG₂ | SG₃ | PATTERN_OUT | I₁₁₁ | I₁₁₀ | I₁₀₁ | I₁₀₀ | I₀₁₁ | I₀₁₀ | I₀₀₁ | I₀₀₀ |
|---|---|---|---|---|---|---|---|---|---|---|---|
| 0 | 0 | 0 | 0 | X | X | X | X | X | X | X | 0 |
| 0 | 0 | 1 | 1 | X | X | X | X | X | X | 1 | X |
| 0 | 1 | 0 | 0 | X | X | X | X | X | 0 | X | X |
| 0 | 1 | 1 | 1 | X | X | X | X | 1 | X | X | X |
| 1 | 0 | 0 | 0 | X | X | X | 0 | X | X | X | X |
| 1 | 0 | 1 | 1 | X | X | 1 | X | X | X | X | X |
| 1 | 1 | 0 | 0 | X | X | X | X | X | X | X | X |
| 1 | 1 | 1 | 0 | 0 | X | X | X | X | X | X | X |

ROBUST MEMORY LINK TESTING USING MEMORY CONTROLLER

FIELD OF THE INVENTION

Embodiments of the present invention are directed to memory link testing and, more particularly, to robust electrical unified testing (REUT).

BACKGROUND INFORMATION

Electrical testing on a memory link from the memory controller has comprised ad hock features that change on a design basis and often are software intensive and very time consuming to run. Electrical validation tools had to be rewritten for each design because there was not common configuration specification. In addition the memory testing hooks of the past have not been built into the normal functional path of the memory controller so tests had to be constructed to emulate the configuration settings for various knobs such as timing, page policy, refresh rate, and power savings.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to one embodiment of the invention, REUT (Robust Electrical Unified Testing) for memory links addresses all of the above discussed issues and leads to orders of magnitude speedup of testing, tool development, and debug. In addition it provides training hooks that have enough performance to be used by BIOS to train parameters and conditions that have not been possible with past implementations.

The "REUT" architecture has been developed to further the standardization of the Interconnect Built-In Self-Test (IBIST) technology. REUT standardizes the register set and the associated access mechanisms to those registers via the long standing PCI programming model. Defining a PCI Function provides a clean break between component implementation and tool development. Instituting the PCI standard programming model along with an accompanying standard register set provides the infrastructure necessary to enable software reuse long term.

Figure 1:
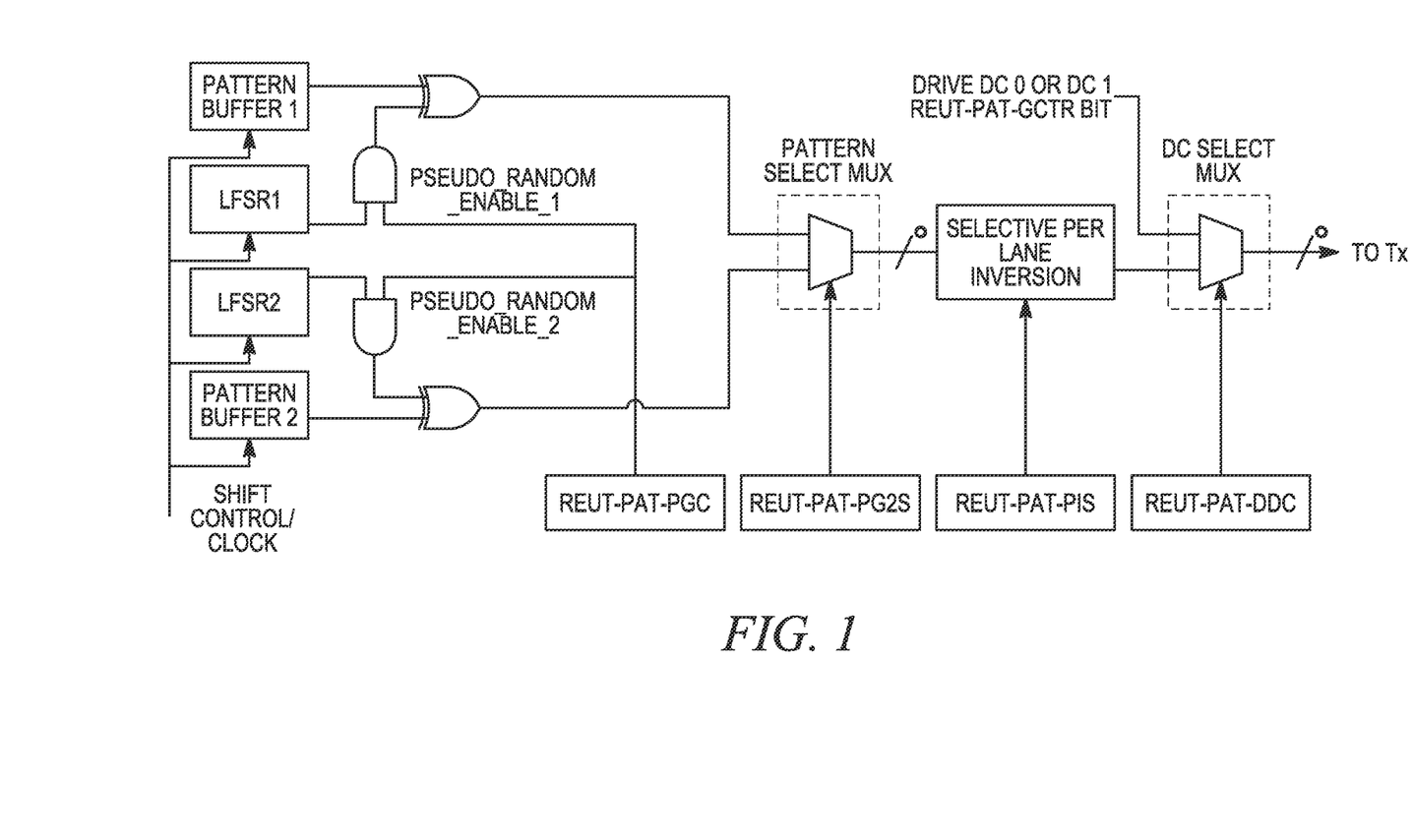
FIG. 1 is a circuit diagram showing the DDR REUT data block.

Referring now to FIG. 1, REUT comprises dedicated address and data generation hardware that utilizes the normal memory controller scheduler path to issue requests to DRAM. A software interface has also been defined to control the hardware. This programming interface is intentionally generic enough to keep consistency between products to minimize the tool recode effort between product families.

The primary testing mechanism for REUT is to use loopback to test for link or dram errors. DDR link loopback is achieved by issuing a write to memory with a known data pattern. This location is later read back and the pattern is checked on a per bit basis to determine if any errors occurred somewhere in the data path from the transmit side of the memory controller to the receive side. The per bit error information is stored in registers during the test and the results are OR'd together to produce a global error indication that can be used to reduce test time when checking the results.

The address generation portion of the hardware can generate memory read and write requests at the maximum rate allowed by the DDR interface. This maximum rate is beneficial to getting the test speedup and allowing the worst case conditions to be targeted. All requests are made with the address specified in the DRAM address mapping scheme. Ranks and pages on the channel can be specified as targets of the test. The request generator can be configured to ping pong requests between ranks and pages to exercise DRAM turnaround cases. For example, to hit all turns arounds between 2 ranks, it would issue the following sequence:

WriteRank0 WriteRank1 ReadRank0 ReadRank1 repeat

Addresses can be generated in a linear fashion or using a Linear Feedback Shift Register (LFSR) to exercise the memory address signals. The number of DRAM reads and writes that are issued in a row to one rank can be specified along with a loopcount that specifies how long the test will run. The loopcount is exponential such that the runtime is proportional to $2^{0(loopcount)}$.

Data is generated in a dedicated path in the IO portion of the design, but this may not a requirement for the invention. The data is generated using a combination of pattern buffers and LFSRes that are controlled through registers to create different combinations of ISI, crosstalk and resonance effects. A buffer select register is available to specify how the data pattern is created for each bit. Lane inversion is also available on a per bit basis using a mask vector to specify the bit(s) to be inverted.

Electrical parameter margining is done by setting up the electrical parameters in the memory controller, on the platform, or in the dimm and running a REUT test. These electrical parameters general control the timing or voltage when IO signals are sampled. The value range can be swept to give the user the full picture of eye diagram.

The same REUT test sweep can be done for the protocol parameters such as turnaround timings, termination settings, or even read CAS latency settings. This can be used by BIOS to optimize performance by minimizing turnarounds or latency. It has also proven to be an invaluable debug tool. REUT tests can be run with the actual settings programmed by BIOS to quickly get feedback on the nature of the failure.

There are really several problems being solved by embodiments of the invention:
1. Bios training
2. Dimm margining
3. Electrical validation test time
4. Memory controller Testing and Debug
5. HVM Testing and Screen capability Other implementations only solved one or two of the problems listed above. They have generally tackled these problems by using software CPU based testing or primitive hardware that allows the user to program short sequences to be driven on the DDR link.

The software based approach has not proven to be reliable across platform and CPU designs. There is also limited control on the timing and ordering of the transactions due to the distance between where the transactions are injected (CPU core) vs REUT (inside the memory controller). This lack of control and variability in test behavior, along with increased test time of the software approach, leaves it less desirable and efficient than REUT.

The ad hoc hardware that allows short sequences to be specified often do not follow the memory protocol and force the programmer to emulate the protocol settings of the DRAM controller. The actual protocol settings are used in REUT so this is not a limitation or added programming complexity. This also allows REUT to be used to debug the protocol logic and settings. Because previous approaches have required multiple programming of short sequences for testings, the software overhead became a majority of the test time. This is not the case with REUT as very long, unique tests can be set up with minimal up front programming.

REUT as described herein allows the user to specify the traffic that gets injected directly into the protocol layer of the memory controller. This allows the test to run with realistic timings and settings. REUT also has dedicated hardware to specify long data sequences with no programming overhead. The combination of command and data generation hardware and the way the transactions are injected and checked are unique the REUT mechanism.

The common programming interface and much of the dedicated hardware is not present in current solutions. An advantage of this invention is the interface through the normal protocol layer to schedule the read and write transactions required for testing. Reduced test time by being able to specify long unique tests that get sequenced by hardware is also not available in current solutions.

REUT has a wide range of usages including bios training, DIMM margining, HVM testing and Electrical link validation. It enables new features in BIOS that allow customers to screen their dimms in a manufacturing environment that save them money and adds to the value of the processor. The DDR link test time is small enough to enable bios features such as training around link electrical issues.

In another embodiment of the invention, DDR interconnect stability is advantageous to platform functionality and booting to OS. As DDR frequency increases to 1600 MTS and beyond, more advanced training circuits are required to optimize the timing. A new method of "advanced data pattern generation" herein described provides the advanced training capabilities, thus enable faster platform DDR frequency (1600 MTS and beyond).

One of the problems with current generation training circuits is they are either too simple (e.g. only generate "1010" toggle) or they require too much silicon area to implement (e.g. put a pattern generator behind every lane).

Embodiments of this invention introduces a new method of "advanced data pattern generation" that solves both above problem by generating complex pseudo random numbers by using only 3, relatively small 23 bit LFSRes.

An advantage of this new method is each lane (there are 72 in the diagram) can have a unique pattern compared to current generation where the same pattern must be duplicated across all lanes. This is a accomplished by reuse of the Write Data Buffer (WDB) that normally buffer the data to the functional path, which are 72 bits wide.

Figure 2:
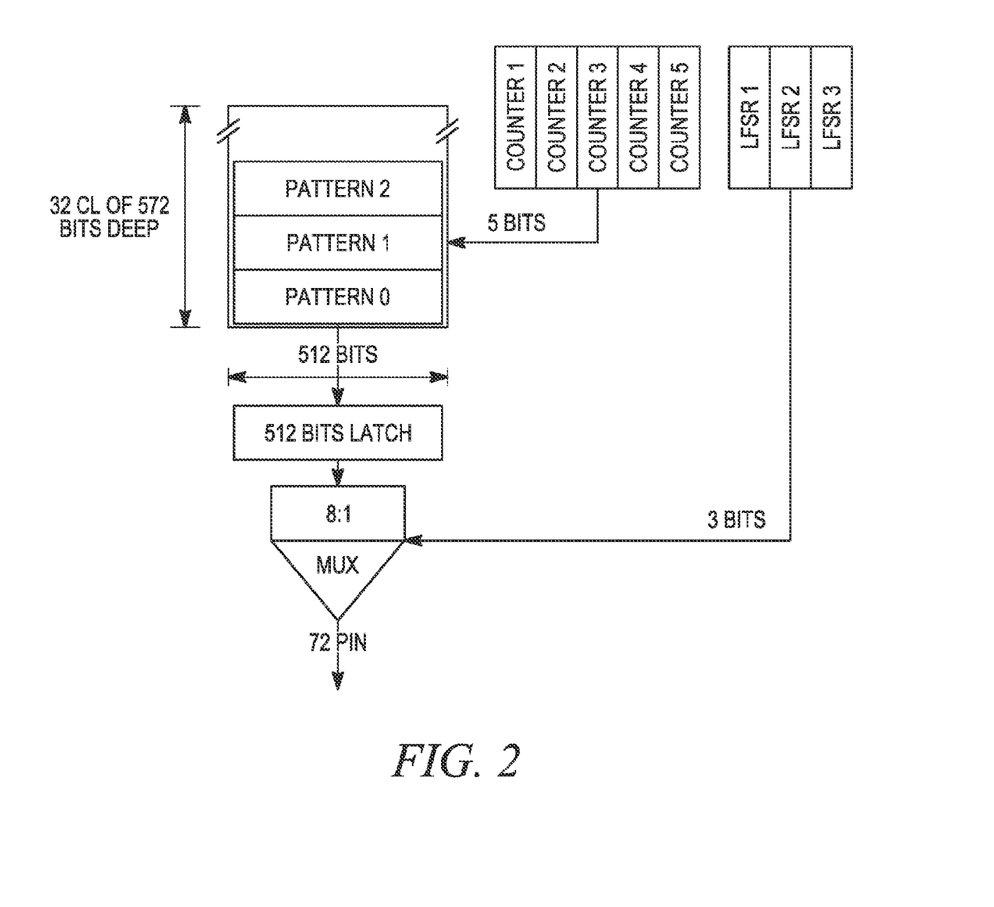
FIG. 2 is a circuit diagram showing a large buffer concept for pattern generation.

Referring now to FIG. 2, is shown the "The Large Buffer (WDB) concept". As shown in FIG. 2, a rectangle is a large buffer. In this case, it comprises of 32 Cache Line deep, and each cache line is 8 bits deep in time. Normally, one cache line is accessible at any given time and it is 512 bits wide. A 8:1 Mux serializes the data into 72 bits wide for the DDR interface. The normal control behind the 8:1 Mux is a linear counter than counts 0, 1, 2, 3, 4, 5, 6, 7, 0, 1, 2, 3. . . In new mode of operation, the linear counter is replaced by LFSRes and M/N, so the 3 bit sequence will no longer be linear.

Figure 3:
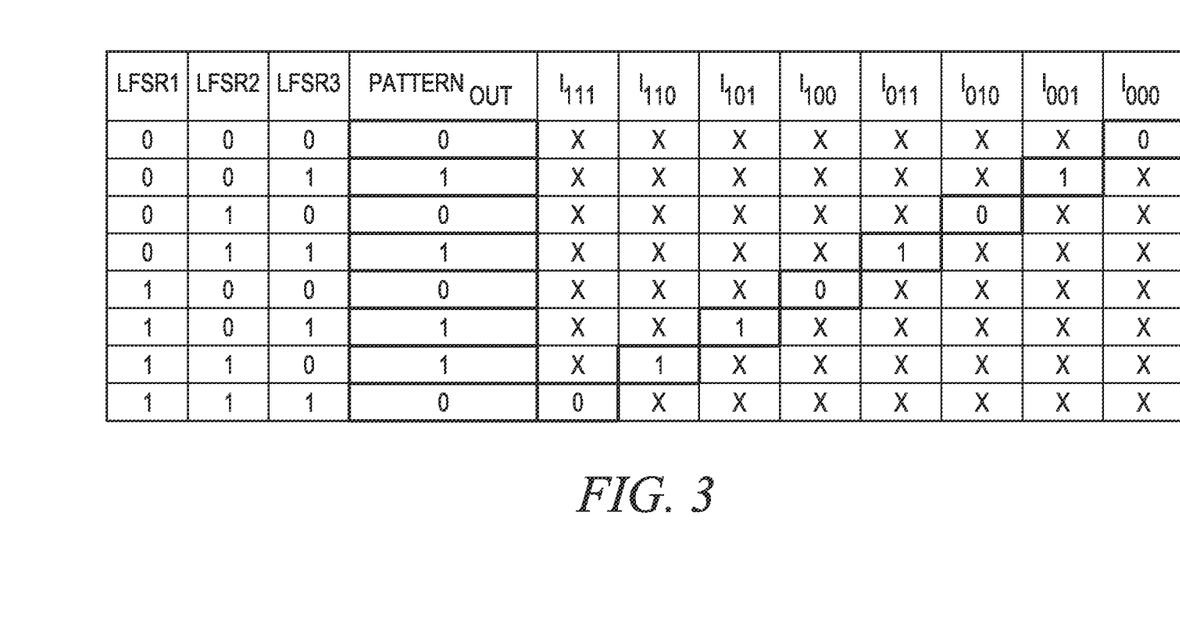
FIG. 3 is a look-up table of arbitrary Boolean combinations of the linear feedback shift registers (LFSRs) shown in FIG. 2.

As illustrated in FIG. 3, the WDB is a large buffer that can contain the look up table of arbitrary Boolean combinations of LFSR1 LFSR2 and LFSR3. To see how this works on a single lane, suppose if the 8 bits in time of WDB of a specific DDR lane was programmed to be the true table "Pattern$_{out}$" of the table below, then the XOR of $LFSR_1$, $LFSR_2$, $LFSR_3$ would be realized at the DDR lane output.

Figure 4:
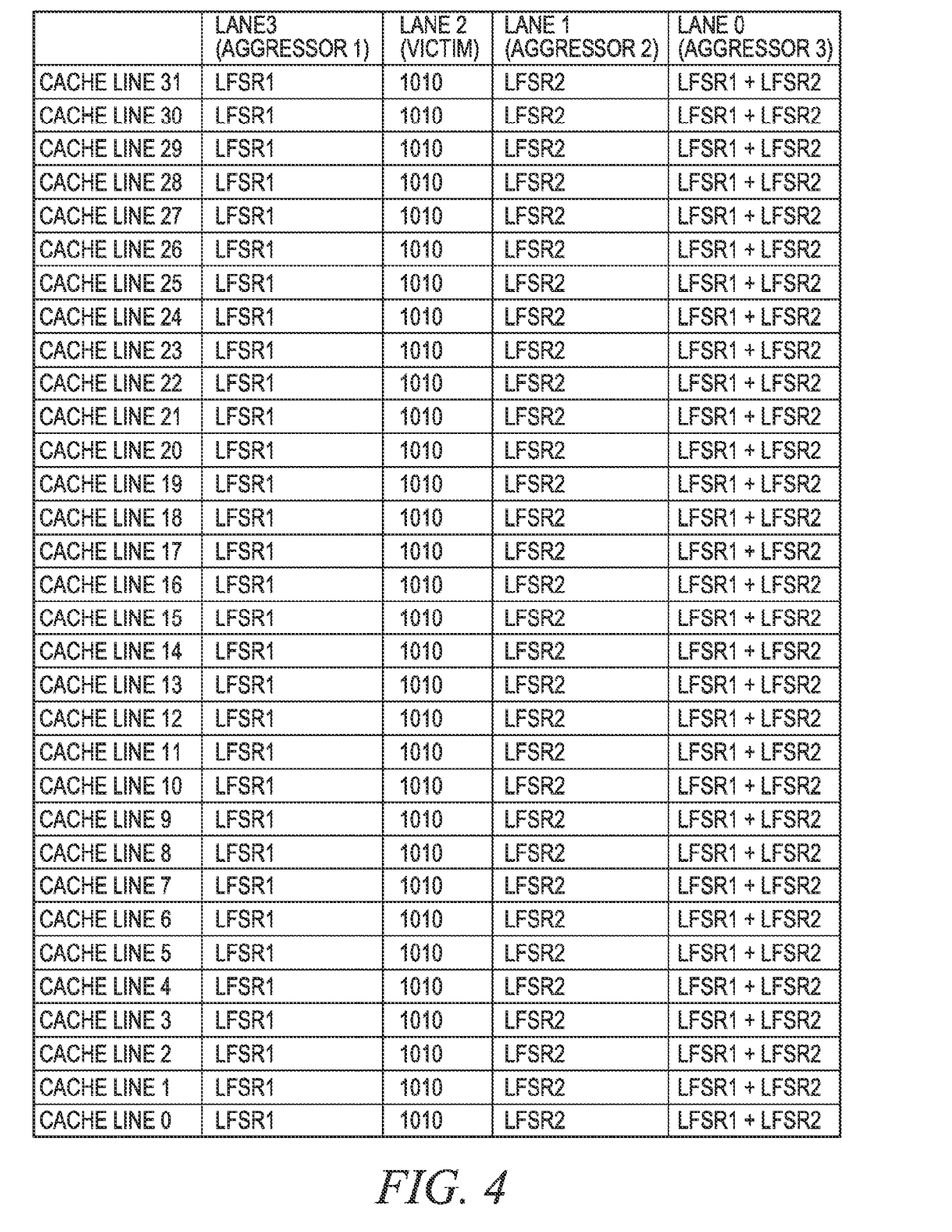
FIG. 4 is a chart showing how multiple types of pattern on different lanes may be used simultaneously.

FIG. 4 is an example that shows how multiple types of pattern on different lanes can be used simultaneously. Each cell of the below table contains 8 bit in time for one lane. As the above pointed out, complex patterns can be generated on a per lane basis. Because the large buffer (WDB) contains enough space to hold unique bits for each lane, now all 72 lanes of the DDR interconnect can be driven by unique patterns by simply change the programming of the WDB. The combination of a large buffer (WDB) and the three LFSR to control the 8:1 mux provides powerful data pattern generation capabilities without increasing significant silicon area.

In yet another embodiment of the present invention, Graphics Double Data Rate (GDDR) interconnect stability is important to platform functionality in terms of integrated or discrete graphics. As GDDR frequency increases to multi-gigahertz and beyond, more advanced training and interconnect diagnostics circuits are required to optimize the timing.

The new method of "advanced data pattern generation" provides the advanced training and interconnect-diagnostics capabilities, thus enable GDDR frequency (multi-gigahertz) and the next generation of platforms with integrated and discrete graphics.

One of the problem with current generation training circuits is they are either too simple (eg: only generate "1010" toggle) or they require too much silicon area to implement (eg: put a pattern generator behind every lane).

Embodiments of this invention introduces a new method of "advanced data pattern generation" solved both above problem by generating complex pseudo random numbers while minimize silicon area by only adding 1 M/N generator and one 32 bit shift register. An advantage of this new method is wider, deeper and richer patterns can be generated across all the lanes.

Figures 5, 5A:
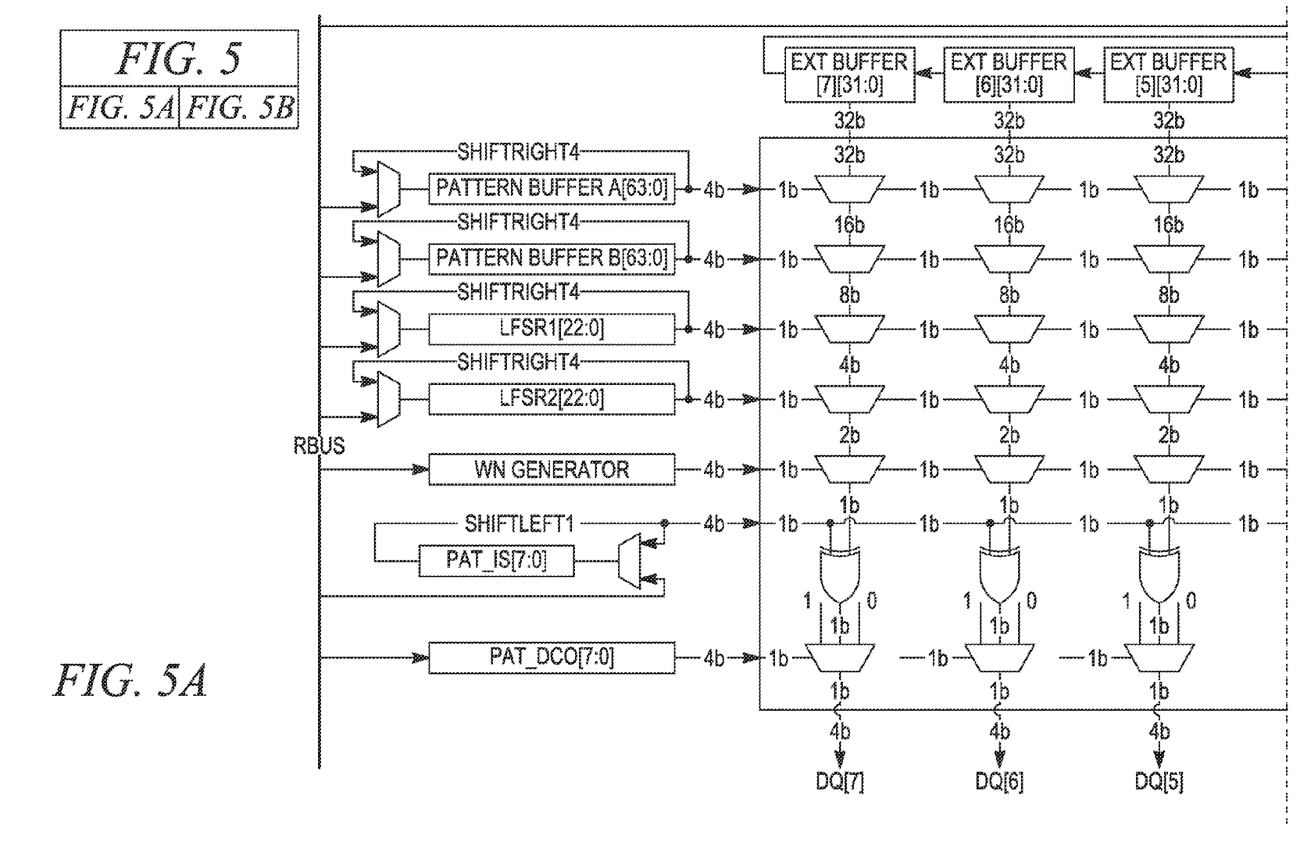
FIG. 5 is a block diagram showing extended buffers to program any Boolean function that controls a unique pattern on any GDDR pin.
Figure 5B:
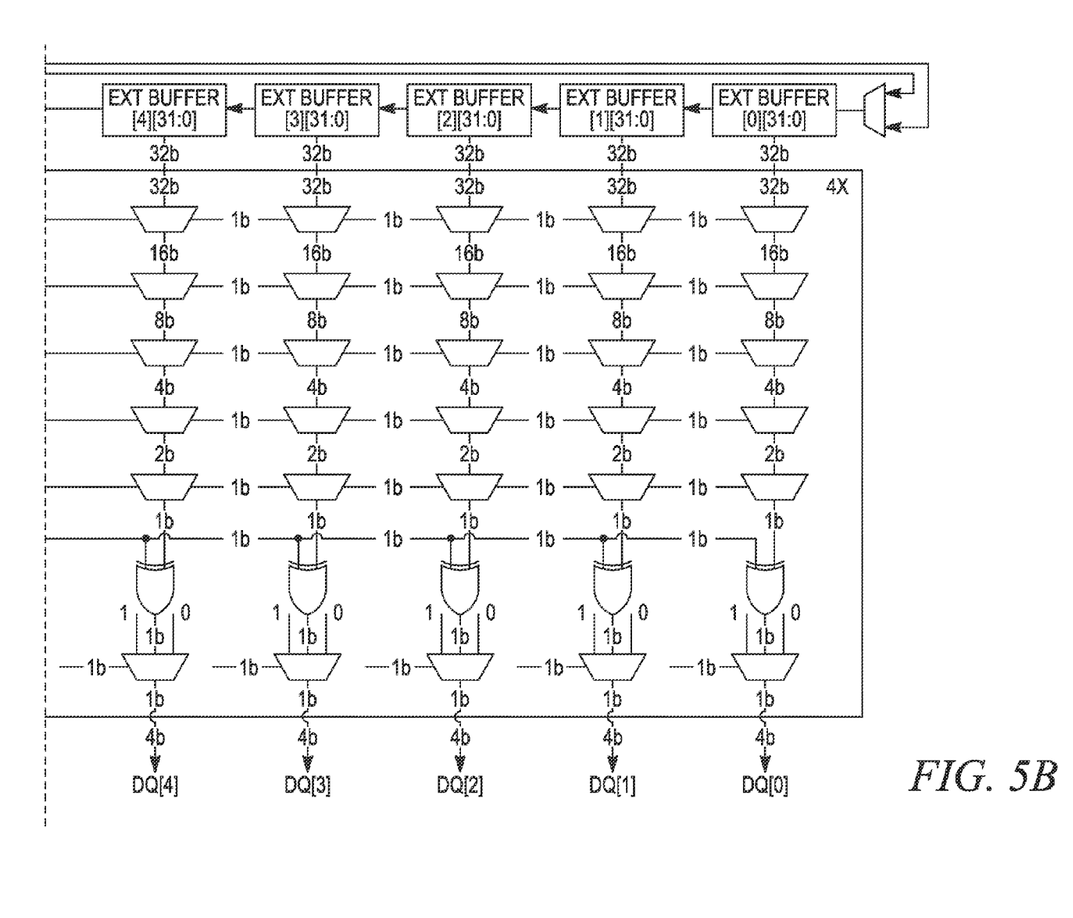
Figure 6:
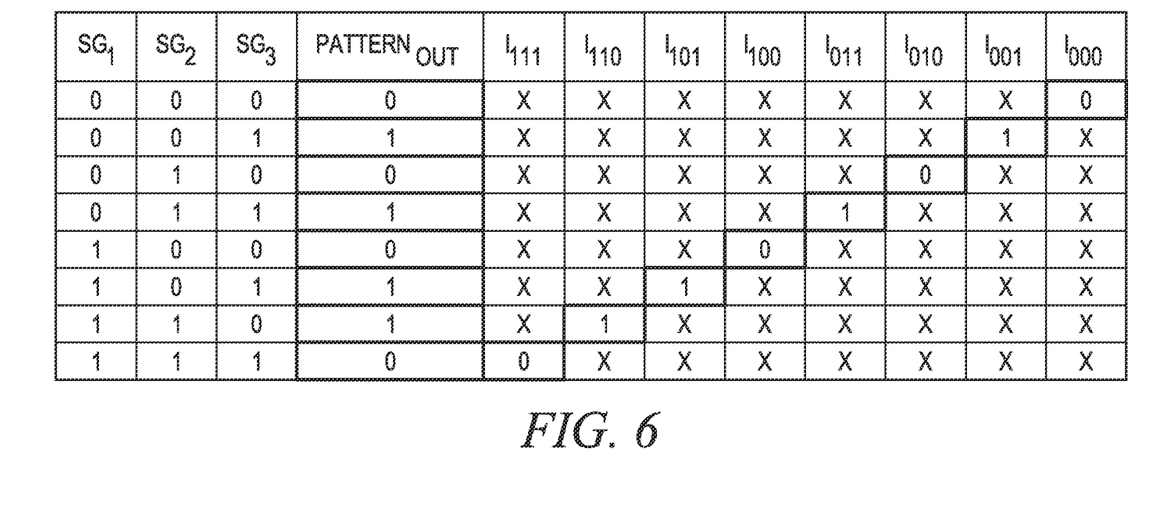
FIG. 6 is a truth table for pattern $_{out}$.

Referring now to FIGS. 5 and 6, suppose if the 8 bits in time a specific GDDR lane was held in an 8 bit buffer, and it was programmed to be the true table "Patternout" of the table below, then the XOR of $SG_1$, $SG_2$, $SG_3$ would be realized at the GDDR lane output. If the $SG_1$, $SG_2$, $SG_3$ are different pseudo-random patterns (eg: LFSR output) mixed with M/N generator, the final output pattern on the GDDR lane would by LFSR1 XOR LFSR2 XOR M/N.

Extended Buffer: Now, extending the LUT concept above to a 32:1 MUX that is controlled by 5 bit MUX-select and 32 bit buffers, now each GDDR lane can be controlled by the "Extended Buffer" shown in the diagram above, which can be used to implement any truth table function of all five functions (two 64 bit pattern buffer, two LFSR, and 1 M/N generator).

Shown in FIGS. 5 and 6, are eight lanes of GDDR, thus eight 32 bit Extended Buffers. These eight extended buffers are connected to form a shift register, thus provide the ability to shift the patterns across 8 lanes.

LFSR: 23 bit shift registers with feedback at specific locations to generate the maximal running length of unique unrepeated pattern.

M/N generator: The M/N generator generates three phases. The precursor is "low", and the length of the precursor can be controlled via register, the "M" refer to the cursor and again the length can be controlled via register. Lastly, the "N" refer to the post-cursor, with a running length of "N" bits in time.

Figure 7:
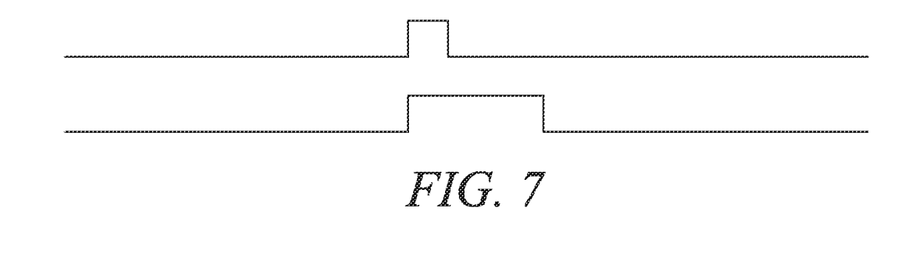
FIG. 7 is an example of a waveform generated by the M/N generator.

FIG. 7 shows some of the waveforms that M/N generator can generate.

Lane inversion: In addition above, the Lane Inversion control can invert a specific lane from the "normal" pattern.

Drive DC: The Drive DC controls if a lane will have DC "1" or "0" instead of the "normal" pattern above.

According to embodiments, the GDDR is trained with complex patterns (LFSR) that is unique on each of the 32 lanes with minimal silicon area increase. Offer advanced interconnect diagnostics patterns on-die. The combination of the "Extended buffer" and the 5 functions (2 LFSR, two 64 bit pattern buffer and 1 M/N) to control the 32:1 mux provides powerful data pattern generation capabilities for training and interconnect diagnostics.

In yet another embodiment of the present invention, DDR interconnect stability is important to platform functionality and booting to OS. As DDR frequency increases to 1600 MTS and beyond, more advanced training circuits are required to optimize the timing.

The current state of art cannot stress the address pins with full bandwidth worst case pattern, because the DDR3 spec does not provide any explicit hooks for training or margining CMD/Address pins. As a result, one is forced to use functional patterns and the CMD/Address must be 100% protocol compliant to the DDR spec. However, requiring protocol compliance makes it much more difficult to create the worst case pattern with a simple pattern generator.

Previous approaches to this problem have not been able to simultaneously create the worst case power delivery, ISI, resonance and crosstalk noise on the bus. For example, it is very difficult to a simple hardware generator that can even full saturate the bandwidth of the CMD/Address bus for more than a few cycles. Lacking this ability to hit the worst case pattern impacts overall system frequency, performance and debug ability.

According to embodiments, a new method of "advanced address pattern generation" provides the advanced training capabilities, thus enable faster platform DDR frequency (1600 MTS and beyond). One of the problem with current generation training circuits is they are either too simple (eg: only generate "1010" toggle) or they require too much silicon area to implement (eg: put a pattern generator behind every lane).

Embodiments introduce a new method of "advanced address pattern generation". An advantage of this new method is the DDR address pins can be stressed at full bandwidth with worst case pattern. In addition, DIMM power delivery systems can be stressed at the same time as training through randomly opening and closing pages.

Figure 8:
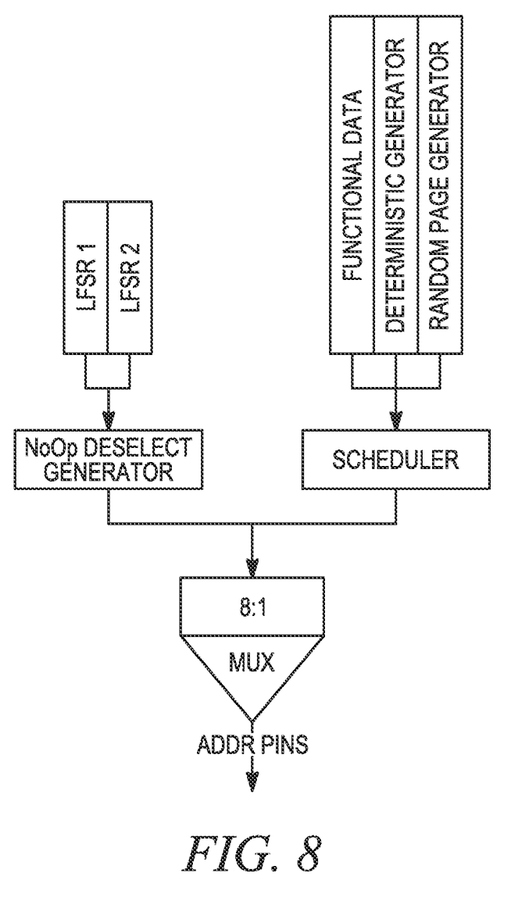
FIG. 8 is a block diagram showing advanced address pattern generation.

Referring now to FIG. 8, there is a block diagram according to one embodiment including several blocks as discussed below.

Background on Scheduler: The purpose of the scheduler is to control the timing of DDR transactions. Protocol level refresh, read, write cycles are all "scheduled" through the scheduler, which has already been validated to be protocol compliant.

Background on Deterministic generator: A deterministic generator is nothing more than a circular FIFO where N addresses are stored. At any given time, 1 of the N addresses will be sent to the scheduler. The Deterministic generator can generate back to back page cycles and back to back rank cycles, hitting worst case turnaround times.

Background on Random Page generator: While the deterministic generator can sequence through N precisely controlled addresses, to add more power rail stress on the DIMM, the "Random Page generator" can generate random open and close page request to other, unused banks. This is important because, unlike the memory controller, the worst case DRAM power delivery does not occur with heavy IO traffic loads. Instead, the highest dI/dT and supply noise is created in the DRAM by page open and close requests. This scheme also allows control over the frequency of the open/close requests and can target different resonance frequencies in the DIMM power delivery network.

How to achieve Full Bandwidth on DDR CMD/ADDR lines: When the scheduler is not busy on the DDR bus issuing commands, the protocol permits NoOp or Deselect commands to be on the bus. In this case, the actual address bits associated with NoOp can be anything, which will be ignored by the DRAM. One way of filling up the full bandwidth is to attach two LFSR behind the NoOp/Deselect address generation. This essentially creates "noisy" pre-cursor and post-cursor to the real address command.

Combining all these pieces into the diagram of FIG. 8, this invention can create full bandwidth traffic on the DDR address command pins, generate precisely the page and rank to stress, stress the power delivery system on the DIMM, and to keep the interconnect noise with NoOp/Deselect traffic and hit a variety of ISI/Xtalk scenarios on the bus through the 2 LFSRes. All these put together make a powerful advanced training circuit that can stress the interconnect quickly to achieve the best training result, thus enabling higher DDR frequencies.

According to yet another embodiment, a new method of "advanced Address pattern generation" can sequence through a range of address as well as randomly jump between a range of address, thus provide the required pattern to optimize GDDR timing. An advantage of this new method is it can apply to variable GDDR memory configuration without changing the hardware.

Figure 9:
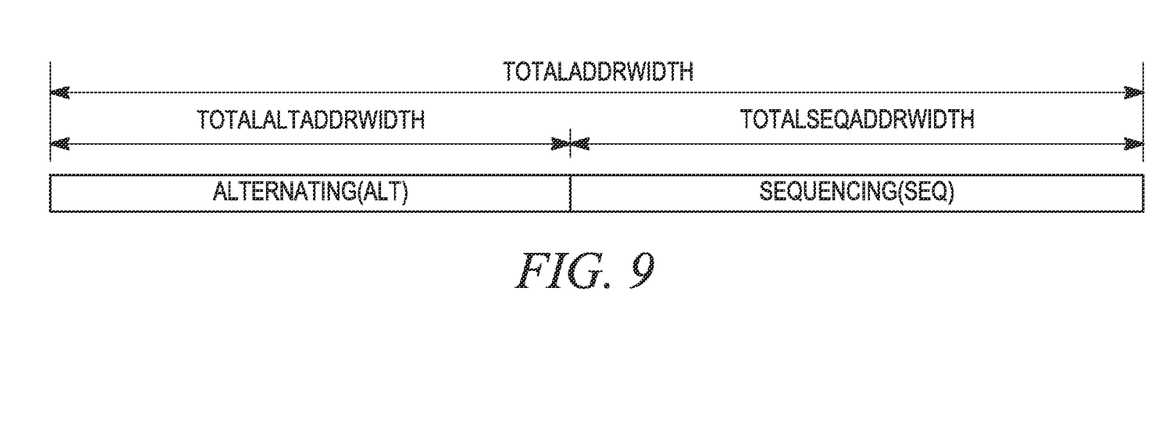
FIG. 9 is a diagram showing an internal address comprising an alternating segment and a sequential segment.

Referring to FIG. 9, there is shown a diagram illustrating background on internal address generation. The address generator would always generate internal address which is shown in FIG. 9. The total internal address comprises of an "alternating" segment and s "sequential" segment. The alternating segment is named this way because this segment of address generation can alternate between N number of address values programmed by registers. The "sequential" segment is named this way because this segment can count sequentially from a starting address to an ending address, and again be programmed by registers. The sequential segment can also be generated by an LFSR to provide random addresses.

Figure 10:
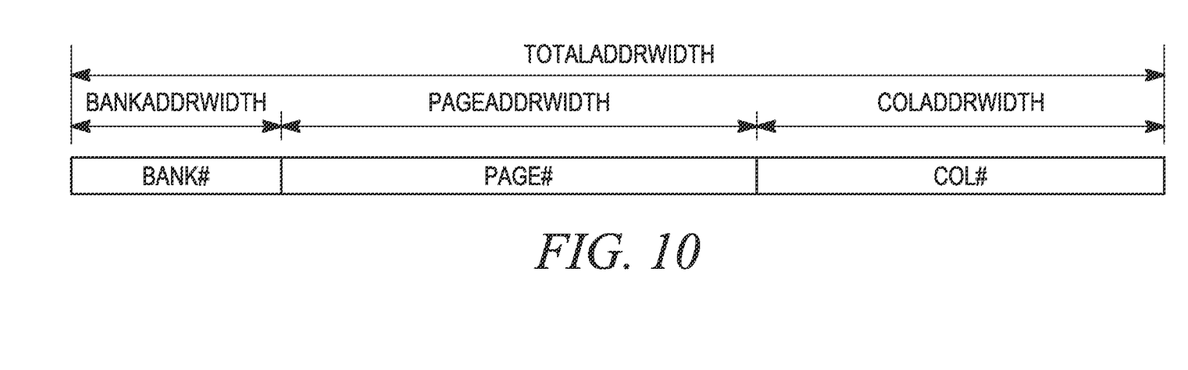
FIG. 10 is a diagram showing an address width comprising bank, page and column bits.

Referring now to FIG. 10, physical address width comprise N bits wide of Bank, M bits wide of page, and O bits wide of columns. Each specific platform can power on with different N, M, O values each time. So, the physical address width depends on how my GDDR memory is present.

Figure 11:
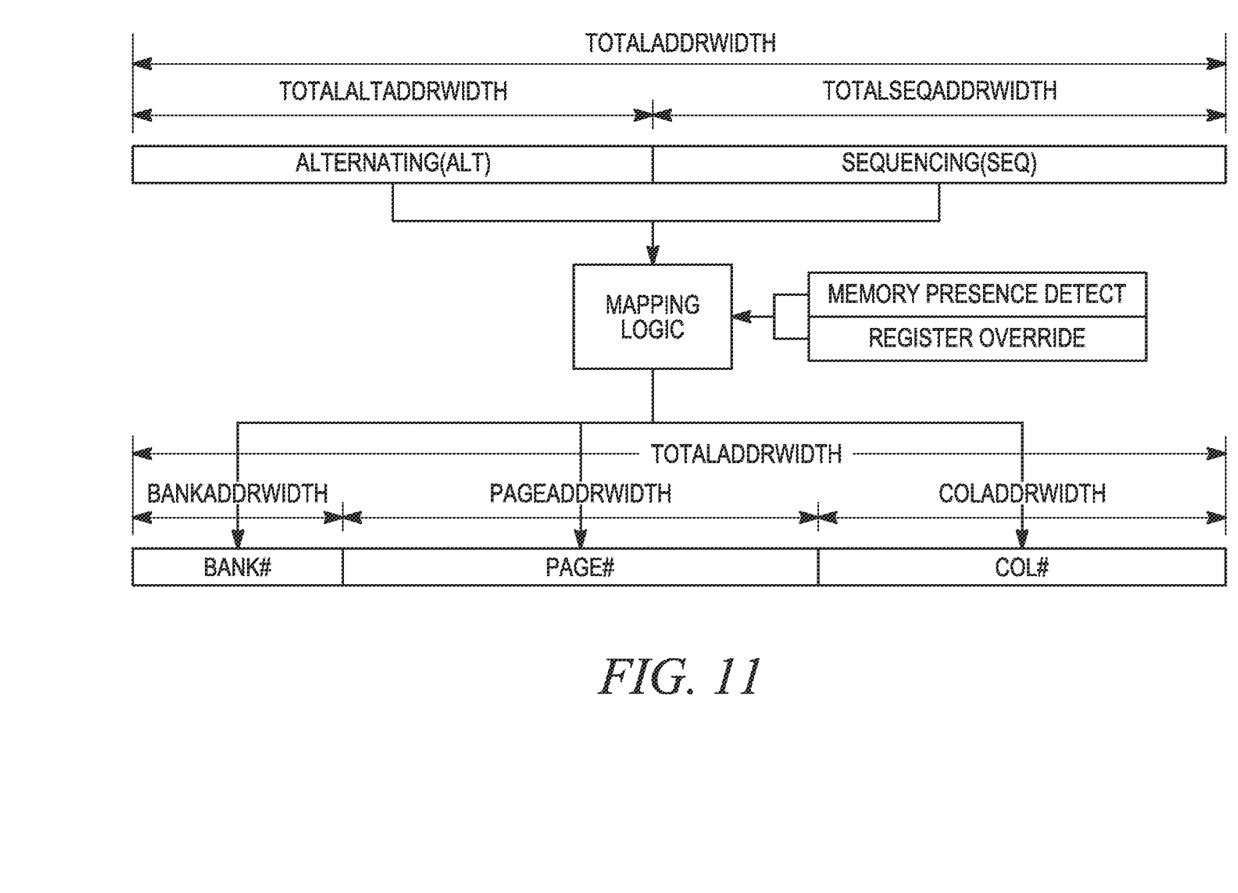
FIG. 11 is a block diagram showing advanced pattern generation.

Obviously, some form of mapping must exist to translate between the internal address and the physical address. Because the physical address width can change at every power cycle, the mapping must be tied to power-on memory presence detect, or be register controlled, and written with correct value before using the address generator. The mapping logic is shown in the diagram of FIG. 11.

Combining all these elements together, now the advanced pattern generator can generate J bits of alternating address, K bits of linear or random address, and map that to any N, M, O bits of physical address. All these can be controlled through memory presence detect or register override. The result is a fully flexible and reusable address pattern generator.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a pattern generator including a data generation portion to generate a pseudo-random data pattern to create a worst case effect for a memory test, the data generation portion to include:
a linear feedback shift register (LFSR);
a pattern buffer; and
hardware coupled to the LSFR and to the pattern buffer, wherein the hardware is to be implemented to combine an input from the LSFR and an input from the pattern buffer to generate the data pattern, wherein the data pattern is to be generated by a combination of a first pattern including multiple bits from the LSFR with a second pattern including multiple bits from the pattern buffer via the hardware, wherein the data pattern is to be generated by a selection of a part of the second pattern from the pattern buffer based on a bit from the LSFR, and wherein the data pattern is output from the hardware and is to include a third pattern that is different than the first and second patterns and that is not longer than the second pattern.

2. The apparatus of claim 1, further comprising:
a data path to issue a command to a memory location; and
a register to store per bit error information based on the data pattern being written to the memory location and data read back from the memory location.

3. The apparatus of claim 2 further comprising logic to produce a global error indication.

4. The apparatus of claim 1, wherein the worst case effect includes one or more effects of resonance, crosstalk, Inter-Symbol Interference (ISI), noise and power delivery.

5. The apparatus of claim 1, wherein the hardware includes an exclusive-OR logic gate.

6. The apparatus of claim 1, wherein the hardware includes a mux.

7. The apparatus of claim 6, wherein the mux includes an input from an extended buffer.

8. The apparatus of claim 6, wherein the mux is to receive a selection bit from the LFSR to generate the pattern.

9. The apparatus of claim 1, wherein the pattern generator includes an address generation portion.

10. The apparatus of claim 9, wherein the address generation portion includes a linear feedback shift register (LFSR) to generate a pseudo-random address pattern.

11. The apparatus of claim 9, further comprising one or more of a no operation generator and a deselect generator.

12. The apparatus of claim 11, further comprising a deterministic generator and a random page generator.

13. The apparatus of claim 9, wherein a total address width is to be divided into a first segment and a second segment, wherein the first segment is to include alternating address patterns, and wherein the second segment is to include random address patterns generated by a linear feedback shift register (LFSR).

* * * * *